United States Patent [19]
Inoue et al.

[11] Patent Number: 6,106,631
[45] Date of Patent: Aug. 22, 2000

[54] PLASMA PROCESSING APPARATUS

[75] Inventors: Naoto Inoue; Tomohiko Yamamoto, both of Nara, Japan

[73] Assignee: Sharp Kabushiki Kaisha, Osaka, Japan

[21] Appl. No.: 09/173,653

[22] Filed: Oct. 16, 1998

[30] Foreign Application Priority Data

Oct. 16, 1997 [JP] Japan .................................. P9-283512

[51] Int. Cl.[7] .................................................. C23C 16/00
[52] U.S. Cl. ......................................................... 118/729
[58] Field of Search ........................... 156/345; 128/715, 128/728; 118/730, 729, 725

[56] References Cited

U.S. PATENT DOCUMENTS

| | | | |
|---|---|---|---|
| 5,352,294 | 10/1994 | White et al. | |
| 5,843,233 | 12/1998 | Van De Ven et al. | 118/715 |
| 5,879,459 | 3/1999 | Gadgil et al. | 118/715 |
| 5,882,417 | 3/1999 | Van De Ven et al. | 118/728 |
| 5,909,994 | 6/1999 | Blum et al. | 414/217 |

FOREIGN PATENT DOCUMENTS 6-340975  12/1994  Japan .

*Primary Examiner*—Richard Bueker
*Assistant Examiner*—Enh Fieler
*Attorney, Agent, or Firm*—Nixon & Vanderhye PC

[57] ABSTRACT

A plasma processing apparatus comprising a susceptor and a shadow frame in a processing chamber and used to process a substrate supported by a substrate support tray by using plasma discharge, the shadow frame being disposed so as to be movably by a guide mechanism provided on the inner wall of the processing chamber. The plasma processing apparatus, capable of carrying out high-speed processing, causes less trouble, requires less number of parts and has a high degree of flexibility in the layout of the processing chamber, while maintaining the advantages of a conventional plasma processing apparatus.

10 Claims, 12 Drawing Sheets

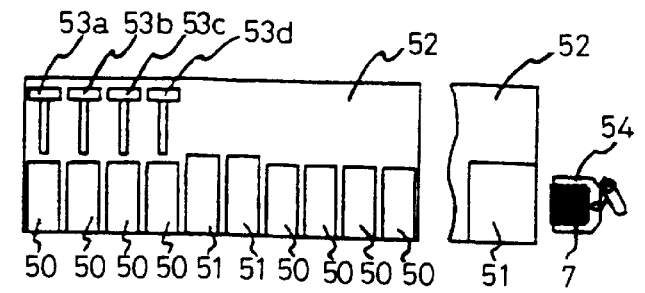
FIG. 11A
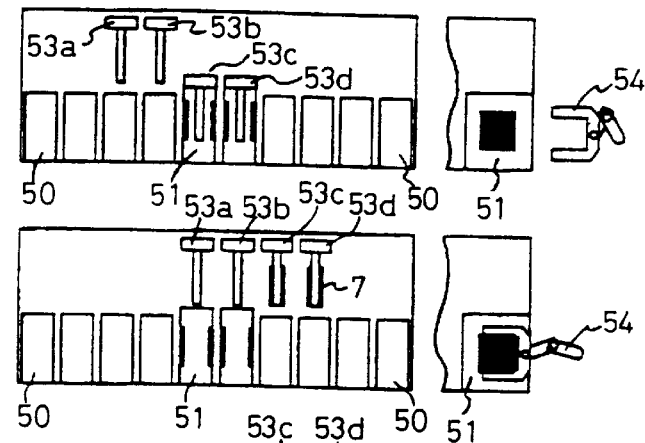
FIG. 11B
FIG. 11C
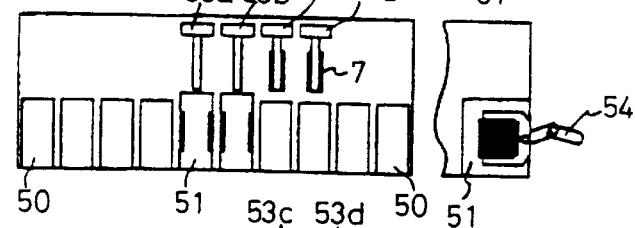
FIG. 11D
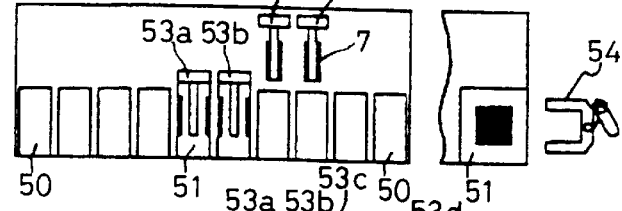
FIG. 11E
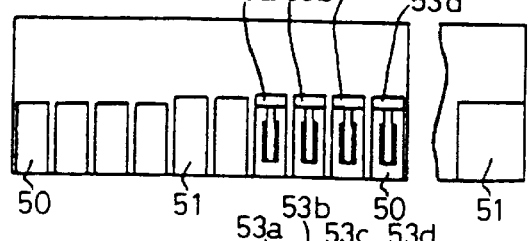
FIG. 11F
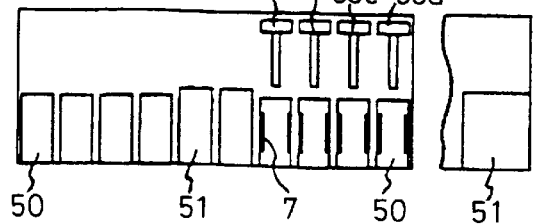

PLASMA PROCESSING APPARATUS

BACKGROUND OF THE INVENTION

1. Field of the Invention

The present invention relates to a plasma processing apparatus for carrying out plasma processing, such as film deposition, etching and ashing, on surfaces of insulated substrates such as semiconductor substrates and glass substrates.

2. Description of the Related Art

Liquid crystal display panels have recently been used widely as display units for word processors, personal computers, television sets and the like. A liquid crystal display panel is structured such that two electrode substrates, each of which is obtained by forming a plurality of thin films made of metal, semiconductor or the like on a transparent substrate made of glass or the like, and by subjecting the thin films to patterning by photo-lithography into desired shapes, are bonded to each other with their electrode-formed surfaces facing each other and with a predetermined space provided therebetween, and the space is filled with liquid crystals.

Processing, such as film deposition, etching and ashing, carried out in processing steps of forming a plurality of thin films made of metal, semiconductor, etc. in desired shapes on transparent substrates has conventionally been carried out in the processing chamber of a plasma processing apparatus as shown in FIG. 12.

Ref erring to FIG. 12, a substrate 7 is loaded from a vacuum or atmospheric system connected to a processing chamber 50 to the processing chamber 50 by a transfer robot (not shown). Generally, the arm of the transfer robot is held in a horizontal condition, and the substrate 7 is mounted thereon. When the substrate 7 is loaded into the processing chamber 50 by using the transfer robot, a space must be reserved between a susceptor 2 and the substrate 7 to allow the arm to be inserted into the space. For this purpose, independently of the susceptor 2, at least four vertically-movable lifting pins 1 are disposed in an area inside the periphery of the substrate 7. Furthermore, to center the substrate 7, a movable centering pin 3 may be disposed independently of the susceptor 2 and the lifting pins 1. By this centering pin 3, the substrate 7 is aligned with a shadow frame 5 used as an evaporation mask for plasma processing. The shadow frame 5 is used to surround and cover several millimeters of the periphery of the upper surface of the substrate 7, and can protect the edge and the backside of the substrate 7 against evaporation. The processing chamber 50, which is made of some metal pieces of aluminum, aluminum alloy or stainless steel, comprises an inner wall 100 which isolates the internal thereof from outside air on a shower plate 8, an inner wall 101 which encloses an inlet 103 to a pump f or drawing air in the processing chamber by suction, and an inner wall 102 (not shown) which is introduced into the processing chamber 50.

Before plasma processing, the susceptor 2 lifts the substrate 7 and the shadow frame 5 while moving upward. At this time, the centering pin 3 and the lifting pins 1 move independently to their retraction positions so that the surface of the susceptor 2 can make contact with the surface of the substrate 7.

After plasma processing, the susceptor 2 moves downward. At this time, the shadow frame 5 stops moving at the receiving portion 6a of the inner wall 6 of the processing chamber 50, thereby being away from the substrate 7.

Since high repeatability is required in production fields, it is indispensable to use a plasma processing apparatus capable of transferring substrates accurately by using the centering pin 3 and the like. Japanese Unexamined Patent Publication 6-340975(1994), for example, has disclosed a plasma processing apparatus having a configuration capable of accurately centering the substrates 7 at all times by performing centering by using the centering pin 3 being movable independently of the susceptor 2.

However, the conventional plasma processing apparatus has problems described below.

First, since the substrate 7 and the shadow frame 5 are lifted during processing, the susceptor 2 is required to be movable, thereby requiring a large-scale movement mechanism on the side of the susceptor 2 of the processing chamber 50. In particular, in the case that the processing chamber 50 is a single-substrate type, movement is repeated for each substrate 7. As a result, trouble is apt to occur at sealing members and ring portions at the boundary portions between the vacuum area thereof and the atmosphere.

Furthermore, the centering pin 3 can carry out centering when the substrate 7 is mispositioned slightly. However, if the substrate 7 is mispositioned significantly, the centering pin 3 will apply extra large force to the substrate 7. If this occurs during processing, such as film deposition, the substrate 7 is warped significantly, thereby making the processing impossible.

Furthermore, since the shadow frame 5 is just loosely mounted on the receiving portion 6a of the inner wall 6 of the processing chamber 50, a load is required to be applied thereto so that the shadow frame 5 functions as a mask for the substrate 7. Moreover, the horizontality of the processing chamber 50 is required to be high.

Besides, since the shadow frame 5 and the substrate 7 make contact with each other each time the processing is carried out, movement before and after processing cannot be performed at high speed in the case that the substrate 7 is formed of glass in particular.

SUMMARY OF THE INVENTION

In order to solve the above-mentioned problems, an object of the present invention is to provide a plasma processing apparatus which causes less trouble, is capable of carrying out high-speed processing, requires a less number of parts and has a high degree of flexibility in layout of a processing chamber thereof, without losing advantages of conventional plasma processing apparatuses.

The invention provides a plasma processing apparatus which is used for processing a substrate by plasma discharge, comprising a susceptor and a shadow frame, wherein the substrate is supported by a substrate support tray.

With the configuration of the present invention, since the substrate is supported by the support tray, the substrate can be supported securely without being warped. In addition, since the substrate is loaded and unloaded under the condition of being supported by the substrate support tray, the substrate can be moved quickly and smoothly.

Furthermore, in the invention it is preferable that the shadow frame is disposed so as to be movable on the inner wall of the plasma processing chamber.

According to the invention, since the shadow frame is moved by a guide mechanism provided on the inner wall of the processing chamber, centering can be carried out securely.

Furthermore, in the invention it is preferable that the susceptor is secured in the processing chamber.

According to the invention, since the susceptor is secured in the processing chamber, no large-scale movement mechanism is required to be provided on the susceptor, thereby making the configuration simpler.

Furthermore, in the invention it is preferable that the shadow frame and the substrate support tray have shapes suited for centering the substrate.

According to the invention, since the shadow frame does not make direct contact with the substrate, the substrate can be moved at high speed.

Furthermore, in the invention it is preferable that the substrate support tray is moved by lifting members provided on the susceptor.

According to the invention, since the lifting members move the substrate support tray, instead of directly moving the substrate, the substrate can be moved smoothly without being damaged.

Furthermore, in the invention it is preferable that the substrate support tray is supported in the plasma processing chamber in a locked condition.

According to the invention, since the substrate support tray is supported in the locked condition, the substrate can be secured firmly, and processed in a vertical condition, instead of a horizontal condition, whereby the configuration of the plasma processing apparatus can have a higher degree of flexibility.

Furthermore, in the invention it is preferable that a single plasma processing chamber is structured so that a plurality of substrates can be processed.

According to the invention, since the single plasma processing chamber is configured so that the plurality of substrates can be processed, simultaneous processing of plural substrates can be carried out, thereby improving productivity because of high-speed processing, and requiring a less number of parts, resulting in reduction in cost of the apparatus.

BRIEF DESCRIPTION OF THE DRAWINGS

Other and further objects, features, and advantages of the invention will be more explicit from the following detailed description taken with reference to the drawings wherein:

FIGS. 11A to 11F are views illustrating the sequence of transferring substrates in the plasma processing apparatus in accordance with the second embodiment.

DETAILED DESCRIPTION OF THE PREFERRED EMBODIMENTS

Figure 1:
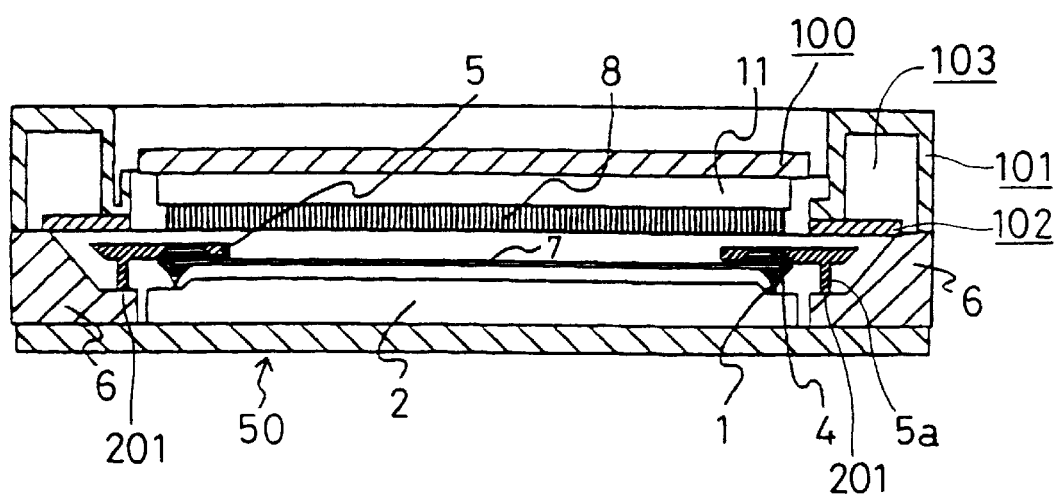
FIG. 1 is a sectional view showing a processing chamber 50 of a plasma processing apparatus in accordance with a first embodiment of the present invention.

Now referring to the drawings, preferred embodiments of the invention are described below.

In the drawings and following description, parts corresponding to those of the prior art apparatus like reference characters are designated by the same reference numerals.

Embodiment 1

FIG. 1 is a sectional view showing a processing chamber 50 of a plasma processing apparatus in accordance with a first embodiment of the present invention, and showing a condition wherein a substrate support tray 4 accommodating a substrate 7 is loaded into the processing chamber 50, and a shadow frame 5 overlies a substrate support tray 4. Processing steps to be conducted until this condition is reached will be described below referring to FIGS. 2 and 3.

Figure 2A:
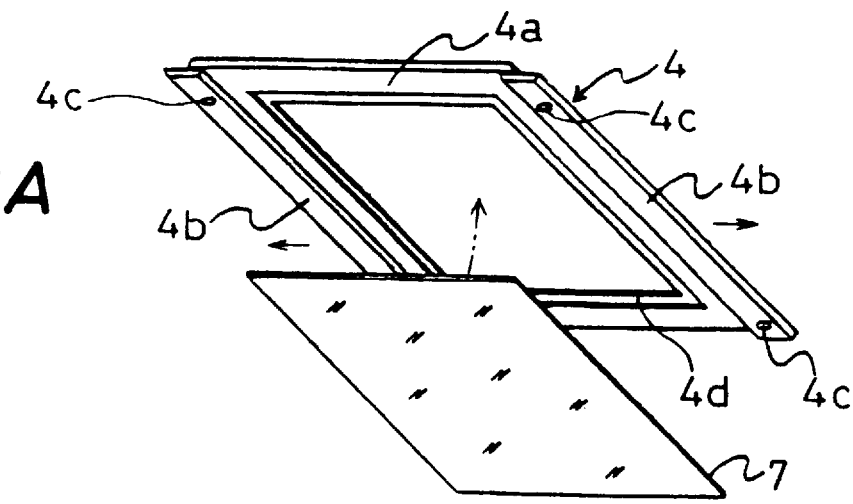
FIGS. 2A, 2B and 2C are perspective views illustrating a procedure to be conducted until a substrate 7 is secured to a substrate support tray 4.
Figure 2B:
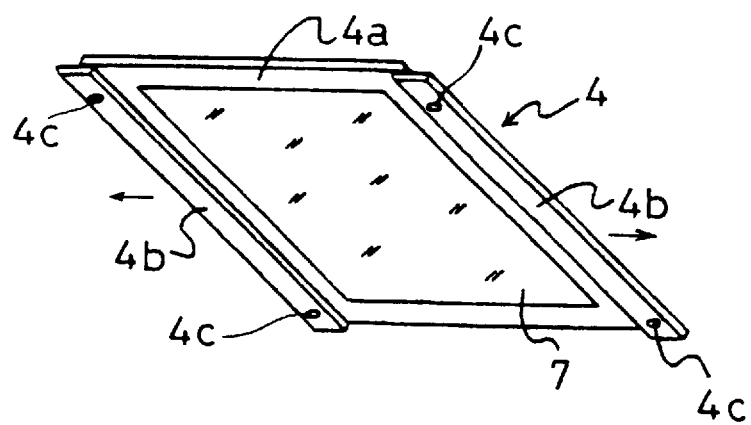
Figure 2C:
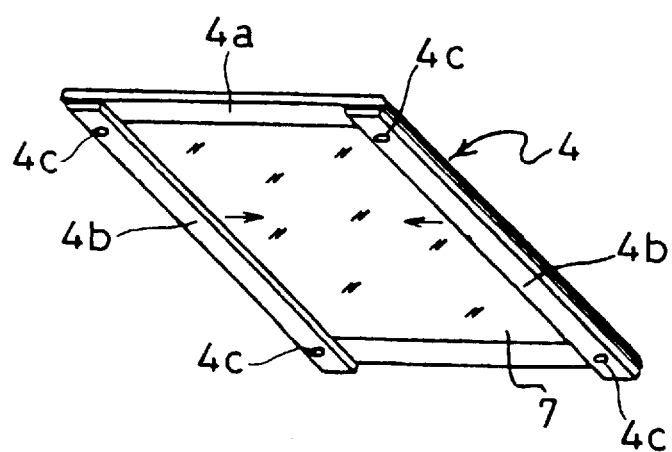

FIGS. 2A, 2B and 2C are perspective views showing a procedure to be conducted until the substrate 7 is secured to the substrate support tray 4. The substrate 7 is secured to the substrate support tray 4 in a chamber other than the processing chamber 50 or in the atmosphere. As shown in FIG. 2A, the substrate support tray 4 comprises a frame-like substrate accommodation member 4a having a recess 4d formed around an inner periphery thereof to accommodate a full periphery of the substrate 7, and a plurality (two in the present embodiment) of substrate holding members 4b which are moved outward when accommodating the substrate 7. Furthermore, contact portions 4c to be engaged with a plurality (four in the present embodiment) of lifting pins 1 described later are formed at both longitudinal ends of the substrate holding members 4b of the substrate support tray 4. The substrate accommodation member 4a, the substrate holding member 4b and the lifting pins 1 are made of aluminum, aluminum alloy, stainless steel or the like.

When the substrate holding members 4b are moved outward by a substrate transfer mechanism (not shown) in the atmosphere as shown in FIG. 2A, the substrate 7 is accommodated in the recess 4d of the substrate accommodation member 4a by another substrate transfer mechanism. Next, the substrate holding members 4b having been moved outward are returned inward by a mechanism such as a spring built in the substrate support tray 4 to secure the substrate 7 as shown in FIG. 2C. However, the method of installing the substrate 7 in the substrate support tray 4 is not limited to this method.

Figure 3:
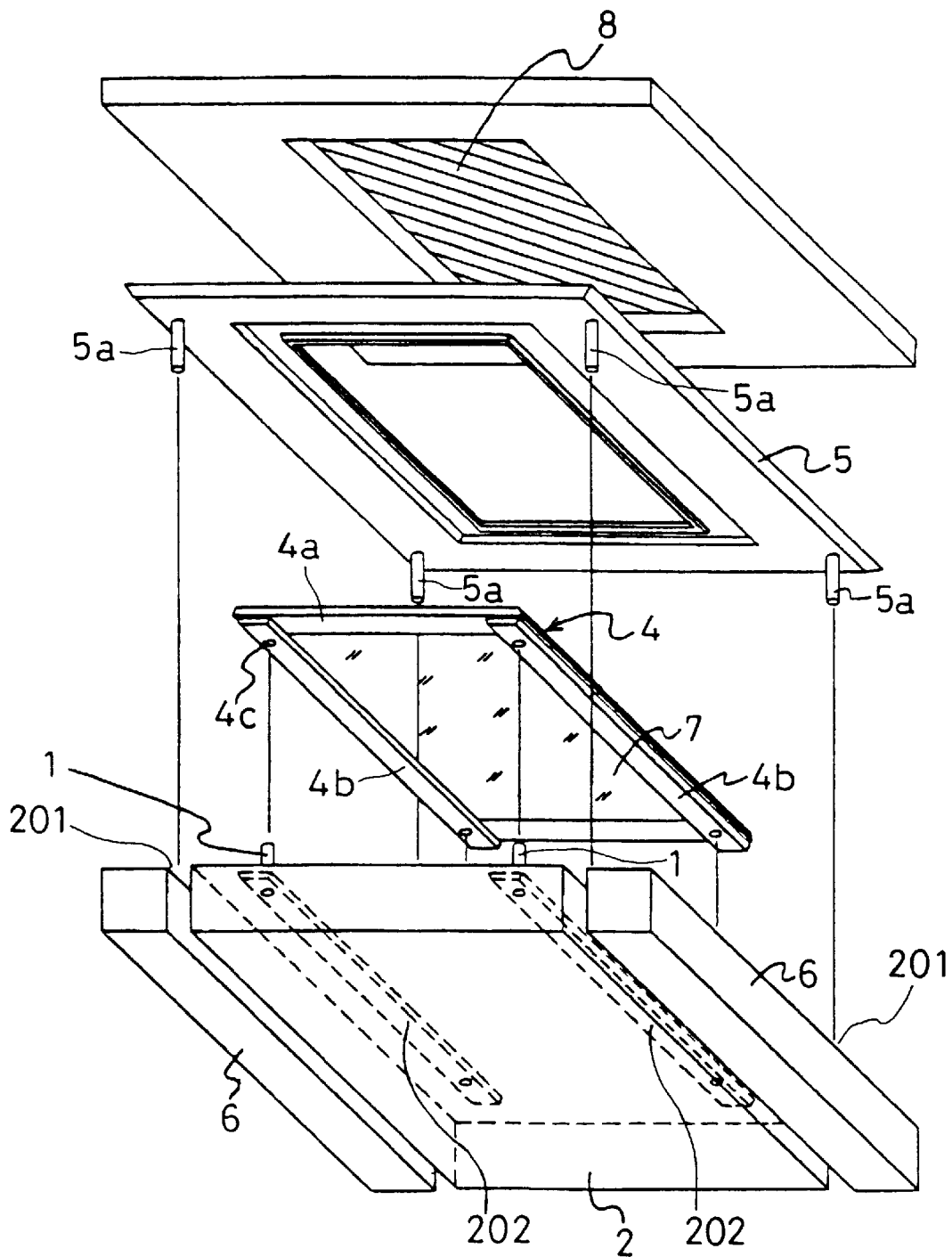
FIG. 3 is an exploded perspective view showing an inner configuration of the processing chamber 50.

FIG. 3 is an exploded perspective view showing the inner configuration of the processing chamber 50. Referring to FIG. 1 as well as FIG. 3, the substrate 7 secured to the substrate support tray 4 is loaded into the processing chamber 50 by a transfer robot, and the contact portions 4c of the substrate support tray 4 are lifted by the lifting pins 1. When the arm of the transfer robot is retracted from the processing chamber 50, the lifting pins 1 move to the susceptor 2, and the backside of the substrate 7 comes in contact with the surface of the susceptor 2. The portions of the susceptor 2, facing the substrate holding members 4b of the substrate support tray 4, are recessed lower than the surface thereof so as to keep clear of the substrate holding members 4b of the substrate support tray 4 so that the susceptor 2 and the substrate 7 can fully make surface contact with each other. Furthermore, the substrate holding members 4b are formed so that they can center the substrate support tray 4. Specifically each substrate holding member 4b has a section which gradually narrows in a direction from a contact of the substrate holding member with the substrate accommodation member 4a toward the contact of the susceptor 2, for example, a trapezoidal section. A guide groove 202 is formed to have a relation of concave and convex with each substrate holding member 4b of the tray 4. With this configuration, the substrate support tray 4 is centered, and mounted on the susceptor 2.

Next, the guide pins 5a of the shadow frame 5 are guided by guide holes formed at least at four positions in the inner wall 6 on the side surfaces of the processing chamber, whereby the shadow frame 5 is moved so as to overlie the substrate support tray 4 and becomes a mask for the substrate 7. At this time, the shadow frame 5 is aligned approximately by the guides and disposed. When pressing the substrate 7, the shadow frame 5 is aligned more accurately by the substrate support tray 4 to become the mask for the substrate 7. In other words, the shadow frame 5 has a recessed portion capable of mating with the substrate support tray 4.

Next, the shadow frame 5 presses the substrate support tray 4 until the backside of the substrate 7 comes into contact with the susceptor 2. After this, the substrate 7 is subjected to plasma processing, and the substrate 7 is unloaded from the processing chamber 50 by the transfer robot by taking the above-mentioned processing steps in the reverse order.

Referring to FIGS. 1 and 3, the susceptor 2 in the processing chamber 50, and the inner wall 6 and the shower plate 8 of the processing chamber 50 are secured. Furthermore, the shadow frame 5 is movable vertically. The substrate support tray 4 to which the substrate 7 is secured is configured so that the tray 4 can be loaded into and unloaded from the processing chamber 50 by the transfer robot.

Figure 4:
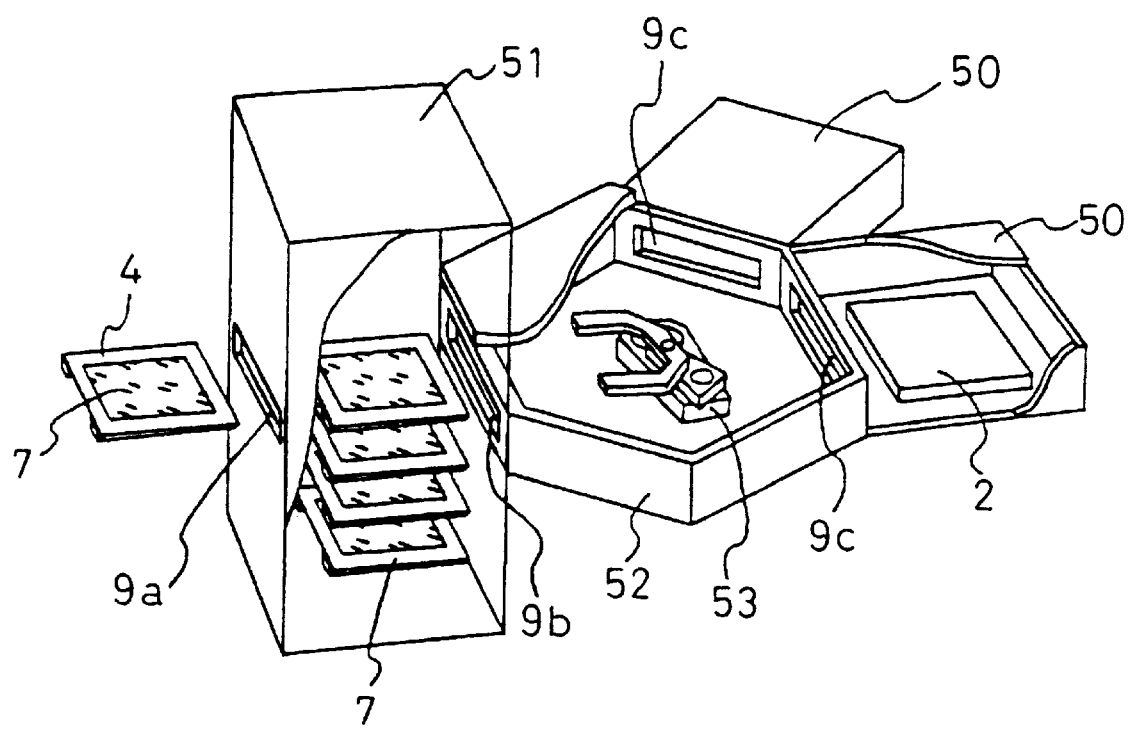
FIG. 4 is an overall view showing an example of the plasma processing apparatus in accordance with the first embodiment.

FIG. 4 is an overall view of an example of the plasma processing apparatus in accordance with the first embodiment. This plasma processing apparatus is configured such that one or more processing chambers 50 having the susceptor 2, the shadow frame (not shown) and the like are disposed on each of given sides of a polygonal transfer chamber 52 provided with a vacuum transfer robot 53 at the center thereof, and such that a load-lock chamber 51 is disposed on each of other given sides of the transfer chamber 52. This configuration is suited to maintain vacuum in the processing chamber during plasma processing and to carry out high-quality plasma processing. In other words, with this configuration, the processing chamber 50 is not directly connected to the load-lock chamber 51 which is opened to the atmosphere and then evacuated again each time the substrate 7 is loaded and unloaded, but connected thereto via the transfer chamber 52 therebetween. As a result, this configuration is advantageous in that the vacuum in the processing chamber 50 can be maintained and that minute dust is less likely to get into the processing chamber 50 from the load-lock chamber 50 which is opened to the atmosphere.

Next, the flow of the substrate 7 will be described below referring to FIGS. 1, 2A to 2C, 3 and 4. As shown in FIGS. 2A to 2C, the substrate 7 is secured to the substrate support tray 4 by an atmospheric robot (not shown). The substrate 7 secured to the substrate support tray 4 is transferred by an atmospheric transfer system to the front of a gate valve 9a of FIG. 4 for shutting off communication between the load-lock chamber 51 and the atmosphere. The lid (not shown) of the gate valve 9a is then opened, and the load-lock chamber 51 is opened to the atmosphere. At this time, the lid (not shown) of the gate valve 9b for shutting off communication between the load-lock chamber 51 and the transfer chamber 52 is closed.

The substrate 7 secured to the substrate support tray 4 is transferred by the atmospheric transfer system, such as an arm, so that one or more substrates 7 are loaded into the load-lock chamber 51. After the number of the loaded substrates 7 has reached a predetermined value, and immediately after the arm is retracted from the gate valve 9a of the load-lock chamber 51 to the atmosphere side, the lid of the gate valve 9a is closed, and evacuation starts at the load-lock chamber 51. When the degree of vacuum in the load-lock chamber 51 reaches a predetermined value, the lid of the gate valve 9b is opened. Next, the vacuum transfer robot 53 extends to a position passing through the gate valve 9b and transfers the substrate 7 secured to the substrate support tray 4 to the transfer chamber 52, and the lid of the gate valve 9b is closed. Next, the vacuum transfer robot 53 transfers the substrate 7 secured to the substrate support tray 4 to a position inside the transfer chamber 52 in front of a predetermined processing chamber 50. Next, the lid (not shown) of the gate valve 9c is opened, and the substrate 7 secured to the substrate support tray 4 is transferred into the processing chamber 50 by the vacuum transfer robot 53.

Next, the lifting pins 1 shown in FIG. 3 move upward to lift the substrate 7 secured to the substrate support tray 4 from the vacuum transfer robot 53 shown in FIG. 4. After this, the vacuum transfer robot 53 is retracted immediately from the processing chamber 50. Immediately after the retraction of the vacuum transfer robot 53, the lid of the gate valve 9c is closed. By taking the above-mentioned processing steps, the substrate 7 is transferred from the atmosphere up to the processing chamber 50 while the substrate 7 remains secured to the substrate support tray 4.

Processing steps to be conducted until plasma processing begins in the processing chamber 50 will be described below. Referring to FIG. 1, immediately after the vacuum transfer robot 53 shown in FIG. 4 is retracted from the processing chamber 50, the pins 1 for lifting the tray 4 to which the substrate 7 is secured move downward, and the backside of the substrate 7 comes into contact with the susceptor 2. Next, the shadow frame 5 is moved downward to overlie the substrate support tray 4 to press the substrate support tray 4 and the substrate 4. In this condition, heating is continued by using a heater (not shown) in the susceptor 2 until the substrate 7 is heated to a prescribed temperature and temperature distribution condition. When the prescribed condition is reached, predetermined plasma processing starts. After the plasma processing, the substrate 7 secured to the substrate support tray 4 is transferred to the atmosphere by taking the above-mentioned processing steps in the reverse order.

Figure 5:
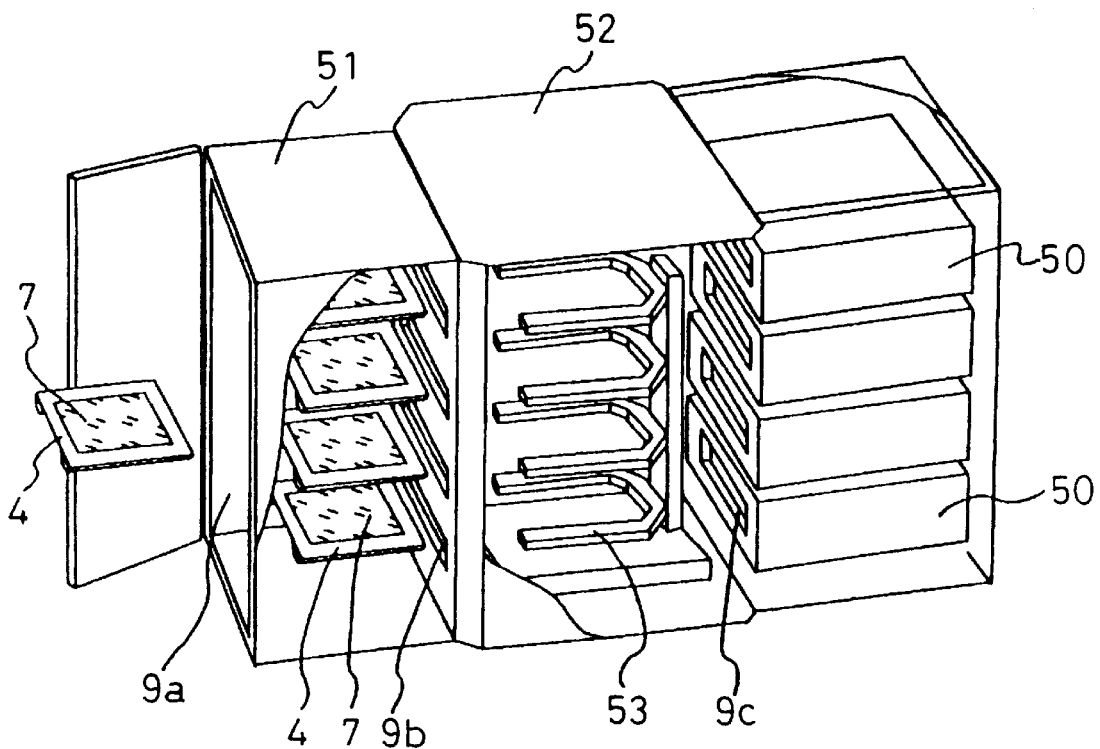
FIG. 5 is an overall view showing another example of the plasma processing apparatus in accordance with the first embodiment.

FIG. 5 is an overall view of another example of the plasma processing apparatus in accordance with the first embodiment. Since the configuration shown in FIG. 5 is basically the same as that shown in FIG. 4, only the components different from those shown in FIG. 4 will be described below. First, a plurality of processing chambers 50 are stacked in the vertical direction, unlike the processing chamber 50 shown in FIG. 4. In addition, a plurality of substrates 7 are transferred simultaneously from the load-lock chamber 51 to a plurality of processing chambers 50 through the transfer chamber 52. For this purpose, a vacuum transfer robot 53 having a plurality of arms is used. With this configuration, the apparatus can have a smaller footprint, and processing time can be shortened.

Embodiment 2

In the configuration in accordance with a second embodiment, the substrate support tray 4 of the first embodiment is held regardless of the lifting pins 1 and gravity. For example, an electromagnet, a permanent magnet, a mechanical mechanism, etc. can be used as a holding mechanism. With this configuration, the processing chamber can be arranged and formed so that a series of processing steps can be carried out with the substrate 7 held in the vertical direction.

Figure 6A:
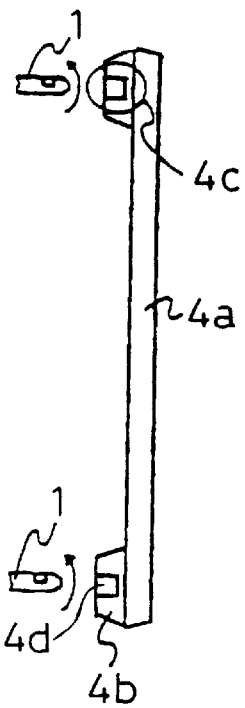
FIGS. 6A, 6B and 6C are views showing a method of securing the substrate support tray 4 in the processing chamber 50 of a plasma processing apparatus in accordance with a second embodiment, FIG. 6A being a side view showing the relationship between the substrate support tray 4 and lifting pins 1, FIG. 6B being an enlarged sectional view showing a condition immediately after the lifting pins 1 enter the substrate support tray 4, FIG. 6C being an enlarged sectional view showing a condition wherein the lifting pins 1 are rotated to lock the substrate support tray 4.
Figure 6B:
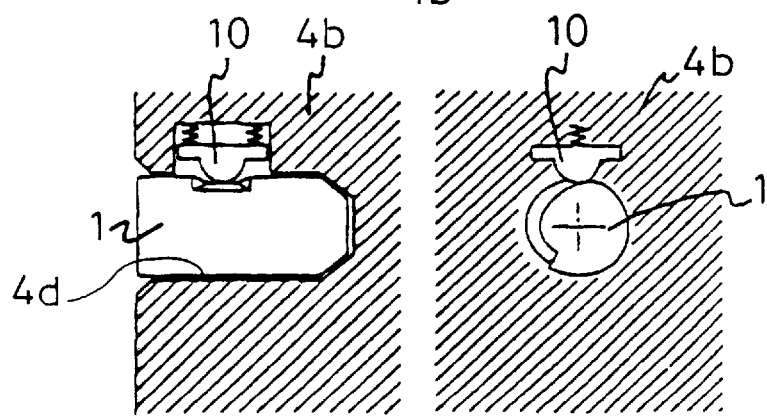
Figure 6C:
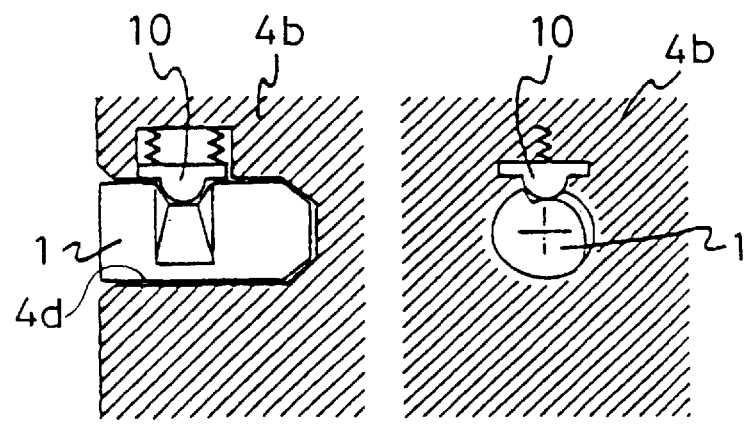

In the case of this configuration, a mechanism for securing the substrate support tray 4 is necessary to prevent the substrate support tray 4 from being detached by gravity in the processing chamber 50 during the transfer of the substrate support tray 4. FIG. 6A to 6C show a securing method by using a mechanical holding mechanism as an example. FIG. 6A is a side view showing the relationship between the substrate support tray 4 and the lifting pins 1; FIGS. 6B and 6C are enlarged views showing the locking portion 4c of the substrate support tray 4; FIG. 6B is a sectional view showing a condition immediately after the lifting pin 1 enters the substrate support tray 4; FIG. 6C is a sectional view showing a condition wherein the lifting pin 1 is rotated to lock the substrate support tray 4.

The substrate support tray 4 is loaded into the processing chamber 50 by the arm of a substrate support tray transfer robot using an electromagnet. At this time, the electromagnet of the arm makes contact with the substrate support tray 4 at the surface of the frame portion of the glass accommodation portion 4a of the substrate support tray 4 on the substrate processing surface side. In this condition, the lifting pin 1 and the substrate support tray 4 can be inserted into and extracted from each other. After entering the substrate support tray 4, the lifting pin 1 is rotated to secure the substrate support tray 4. The lifting pin 1 is provided with a groove so that the diameter of the pin at its partial side surface changes as the pin is rotated. Therefore, when the lifting pin 1 is rotated, a lifting pin locking mechanism 10 built in the substrate support tray 4 is activated to secure the substrate support tray 4. The substrate support tray 4 can be removed easily by releasing the locking condition by rotating the lifting pin 1. Since the configuration of the lifting pin 1 shown in FIG. 1 is just replaced with that having the lifting pin locking mechanism shown in FIG. 6, the overall configuration of the processing chamber 50 remains the same except for the configuration of the lifting pin 1. Therefore, the explanation of the overall configuration is omitted here.

Figure 7:
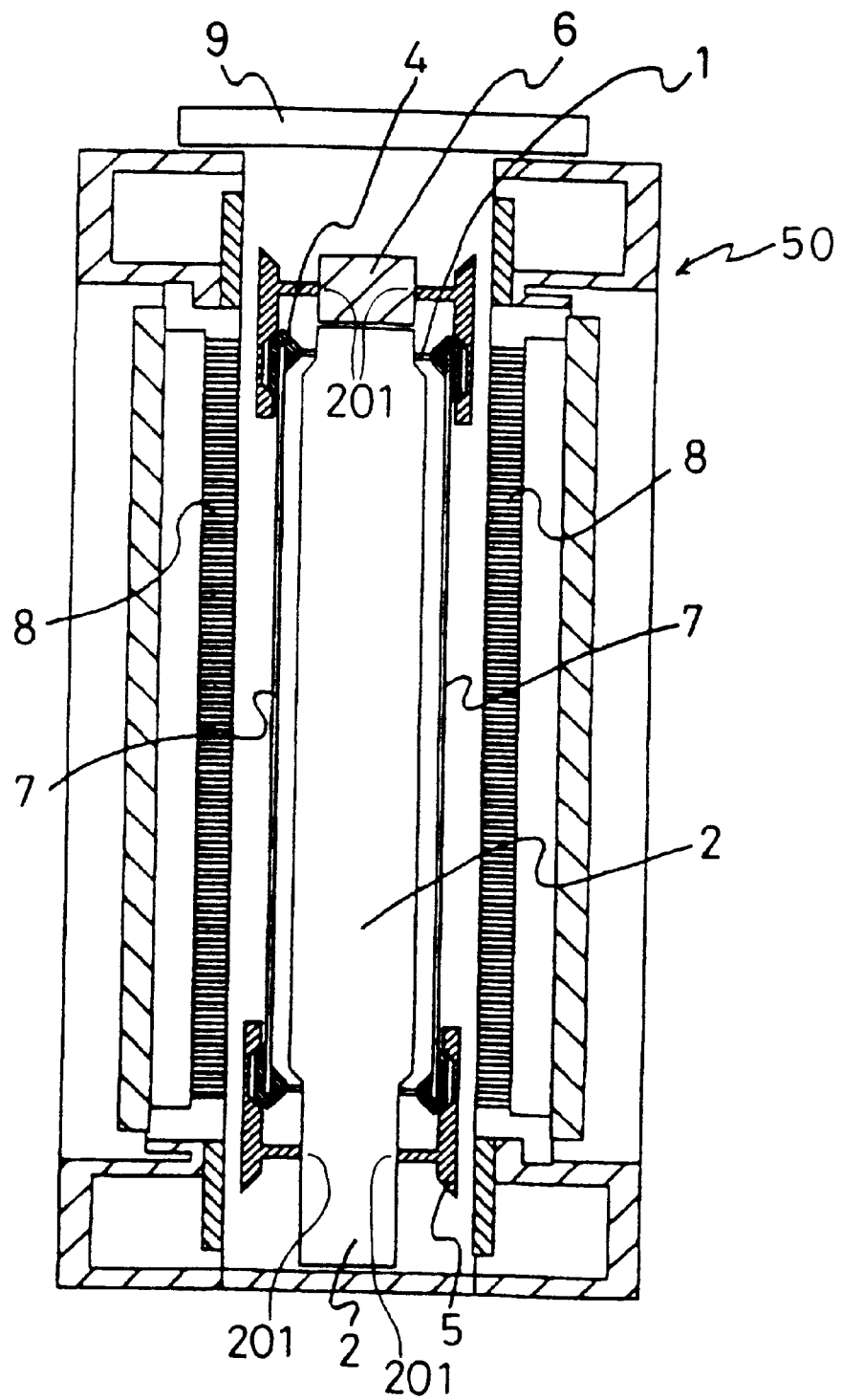
FIG. 7 is a sectional view showing another example of the processing chamber 50 in accordance with the second embodiment.
Figure 8:
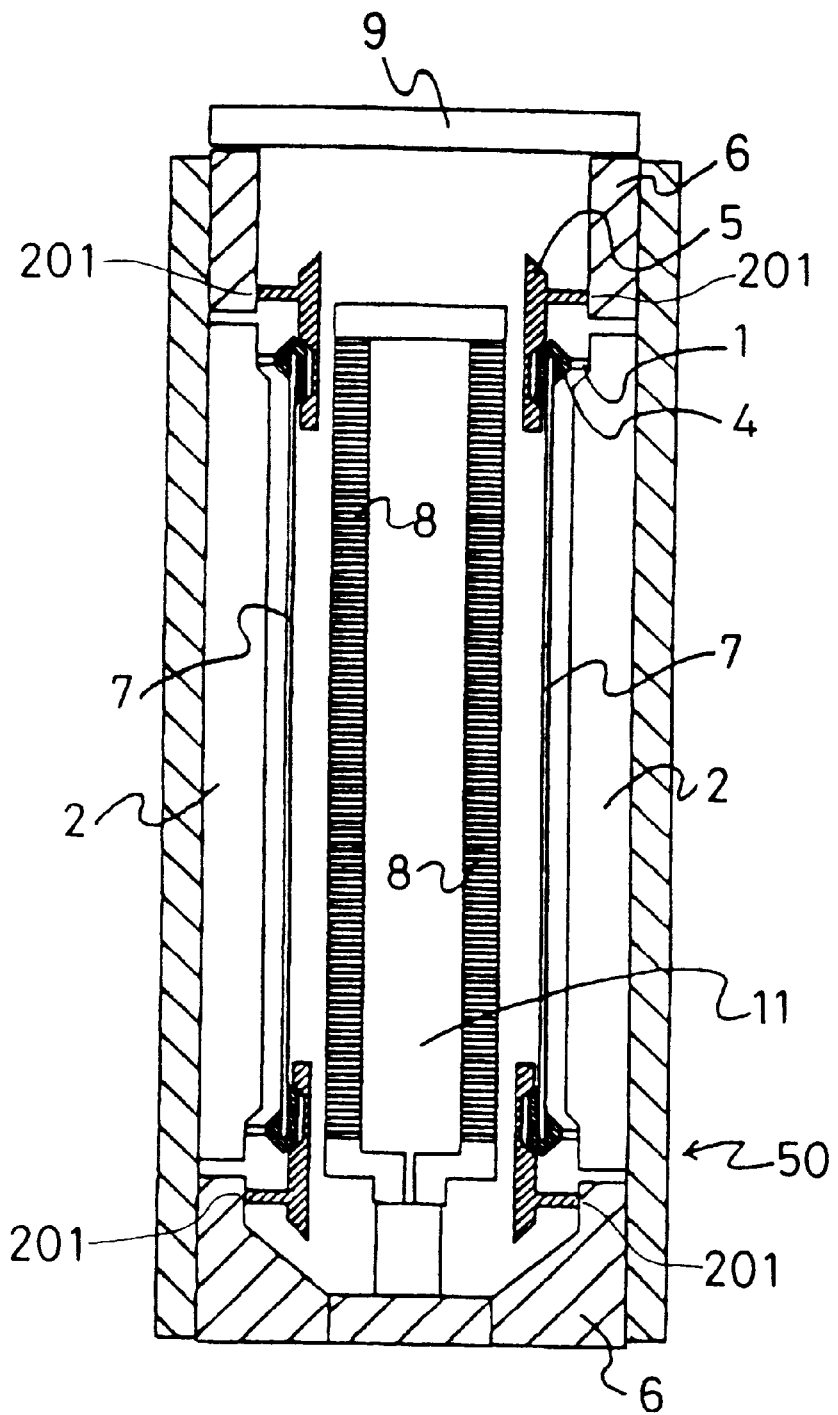
FIG. 8 is a sectional view showing yet another example of the processing chamber 50 in accordance with the second embodiment.

As shown in FIG. 7, in a vertical-type processing chamber 50, a susceptor 2 is provided at the central portion of the processing chamber 50, and a substrate support tray 4, a shadow frame 5, etc. are disposed on each side of the susceptor 2 so that two substrates 7 can be mounted with their surfaces to be processed directed outward. Since the susceptor 2 and the gate valve 9 are each used in common in this configuration, two substrates can be processed in one processing chamber. Furthermore, as shown in FIG. 8, in another vertical-type processing chamber 50, a gas supply portion 11 is provided at the central portion of the processing chamber 50, and a susceptor 2, a substrate support tray 4, a shadow frame 5, etc. are disposed on each side of the gas supply portion 11 so that two substrates 7 can be mounted with their surfaces to be processed directed inward. Since the gas supply portion 11 and the gate valve are each used in common, two substrates can be processed in one processing chamber.

Figure 9:
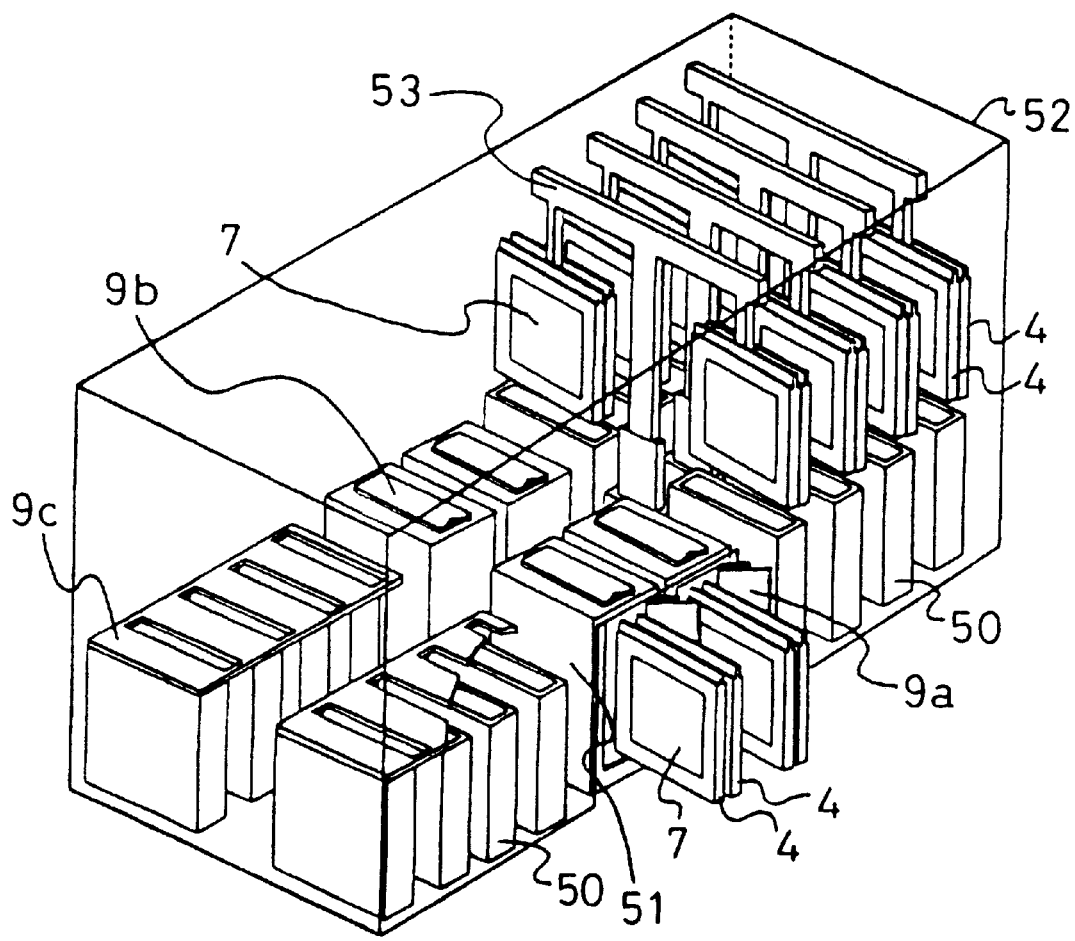
FIG. 9 is a perspective view showing the configuration of a substrate up/down insertion type plasma processing apparatus made by using the processing chambers 50 of the present invention.
Figure 10:
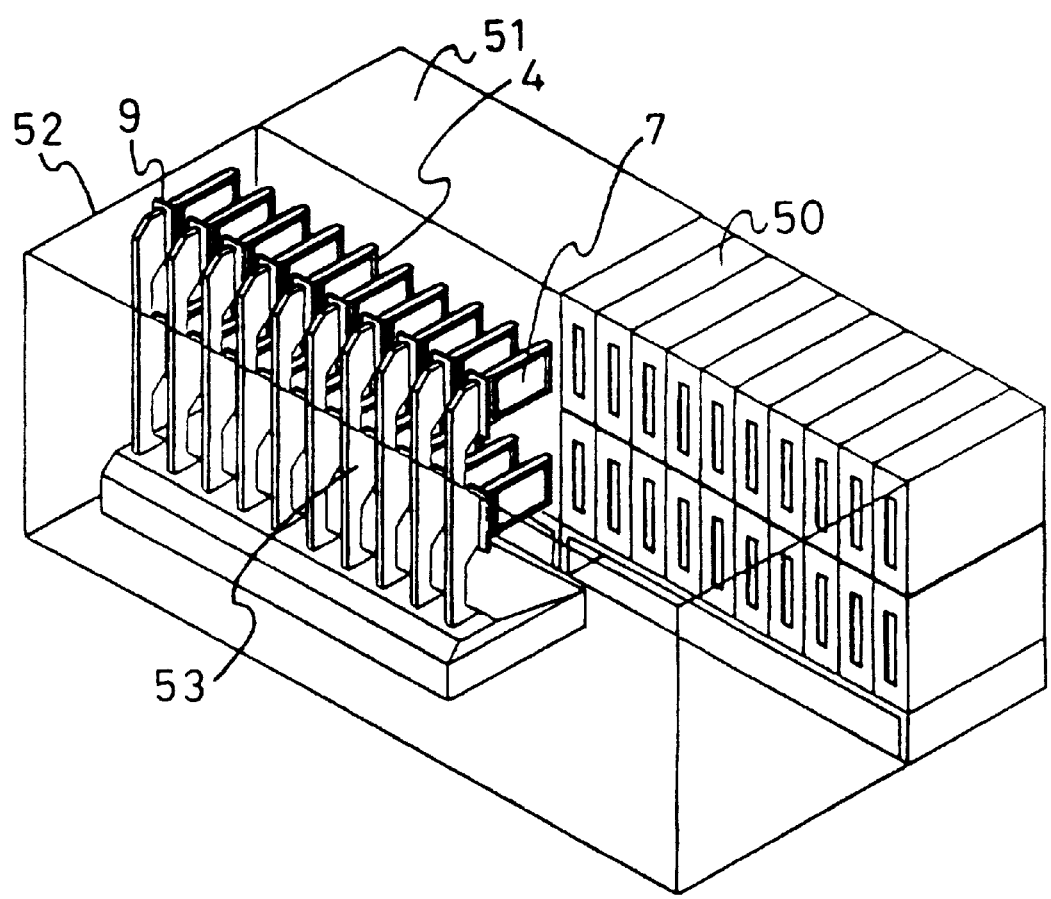
FIG. 10 is a perspective view showing the configuration of a substrate right/left insertion type plasma processing apparatus made by using the processing chambers 50 of the present invention.
Figure 12:
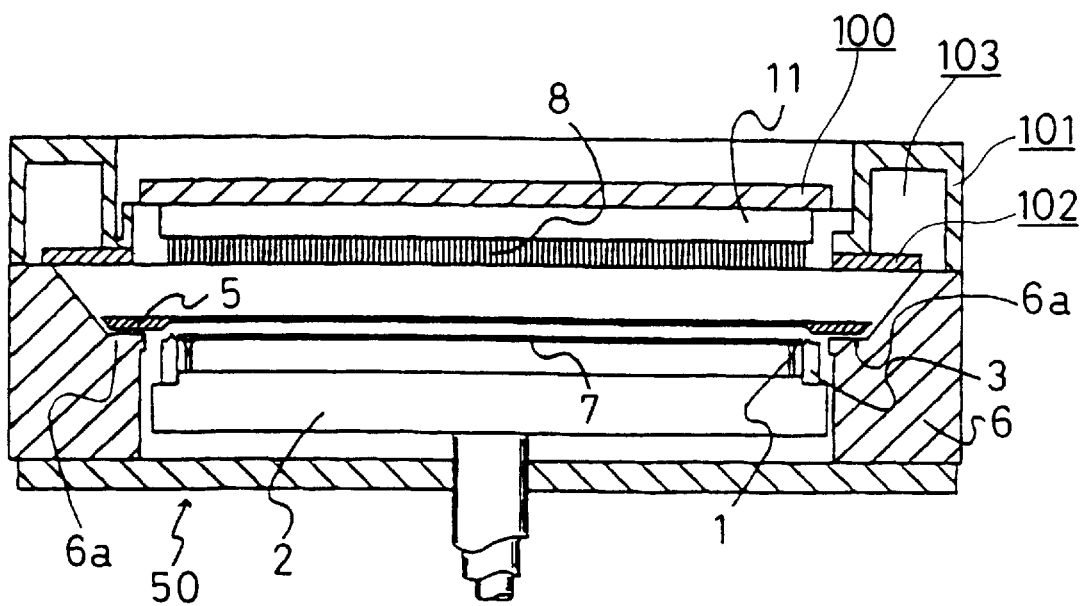
FIG. 12 is a sectional view showing the configuration of the processing chamber of a conventional plasma processing apparatus.

FIGS. 9 and 10 show concrete examples of the overall configurations of plasma processing apparatuses incorporating the processing chambers 50 shown in FIG. 7 or 8. In the plasma processing apparatuses, a plurality of the processing chambers 50 shown in FIG. 7 or 8 are disposed, and a plurality of load-lock chambers 51 accommodating one block of a predetermined number of the processing chambers 50 are disposed. This load-lock chamber 51 is opened to the atmosphere during the loading/unloading of the substrate 7, and used for connection between the atmosphere and a transfer chamber 52. In the transfer chamber 52, a vacuum transfer robot 53 is disposed to transfer the substrate 7. Two or more substrate support trays 4 to which the substrates 7 are secured are transferred simultaneously to the processing chamber 50. In the plasma processing apparatus shown in FIG. 9, transfer between the processing chamber 50 and the vacuum transfer robot 53 is carried out in the vertical direction. Furthermore, in the plasma processing apparatus shown in FIG. 10, transfer between the processing chamber 50 and the vacuum transfer robot 53 is carried out in the horizontal direction.

In order to provide a general explanation of the plasma processing apparatus of FIG. 9, the side and front views of the major portion of the apparatus are given in FIG. 11. The side view is taken by viewing the plasma processing apparatus in the y direction of the perspective view of FIG. 9, and the front view is taken by viewing the apparatus in the x direction of FIG. 9. In other words, the side view of the plasma processing apparatus and the partially sectional front view of the load-lock chamber 51 shown in the side view are given in FIG. 11.

Next, the flow of the substrate 7 will be described below referring to FIGS. 2A to 2C, 6A to 6C, 8, 9 and 11. As shown in FIG. 2, the substrate 7 is secured to the substrate support tray 4 by an atmospheric transfer robot (not shown). As shown in FIG. 11A, the substrates 7 secured to the substrate support trays 4 are transferred by an atmospheric transfer robot 54 to the front of the gate valve 9a of FIG. 9 for shutting off communication between the atmosphere and the load-lock chamber 51. The lid of the gate valve 9a is opened, and the load-lock chamber 51 is opened to the atmosphere. The substrates 7 secured to the substrate support trays 4 are then loaded into the load-lock chamber 51.

After the loading, the substrates 7 secured to the substrate support trays 4 are held by the tray locking mechanisms shown in FIG. 6 and provided in the load-lock chamber 51. At this time, the lid of the gate valve 9b for shutting off communication between the load-lock chamber 51 and the transfer chamber 52 is closed. Immediately after the atmospheric transfer robot 54 is retracted from the gate valve 9a of the load-lock chamber 51 to the atmosphere, the lid of the gate valve 9a is closed, and evacuation starts in the load-lock chamber 51.

When the degree of vacuum in the load-lock chamber 51 reaches a predetermined value, the lid of the gate valve 9b shown in FIG. 9 is opened. As shown in FIG. 11B, vacuum transfer robots 53c and 53d move up to a position passing through the gate valve 9b, and transfer the substrates 7 secured to the substrate support trays 4 to the transfer chamber 52. The lid of the gate valve 9b shown in FIG. 9 is then closed. As shown in FIGS. 11C and 11D, the vacuum transfer robots 53a, 53b, 53c and 53d move in the x direction of FIG. 9. The processing steps shown in FIGS. 11A and 11B are conducted again so that the vacuum transfer robots 53a and 53b are also used to transfer the substrates 7 secured to the substrate support trays 4. As shown in FIG. 11E, the lid of the gate valve 9c is opened, and a plurality of the substrates 7 secured to the substrate support trays 4 are transferred simultaneously into the processing chambers 50 by the vacuum transfer robots 53a, 53b, 53c and 53d.

Next, the lifting pins 1 shown in FIG. 8 move, and the substrates 7 secured to the substrate support trays 4 by the tray locking mechanism shown in FIGS. 6A to 6C are transferred from the vacuum transfer robots 53a, 53b, 53c and 53d shown in FIG. 11A to 11F to the processing chambers 50. Next, as shown in FIG. 11F, the vacuum transfer robots 53a, 53b, 53c and 53d are immediately retracted from the processing chambers 50. Immediately after the retraction of the vacuum transfer robots 53a, 53b, 53c and 53d, the lid of the gate valve 9c shown in FIG. 9 is closed. By taking the above-mentioned processing steps, after being secured to the substrate holding trays 4, the substrates 7 are transferred from the atmosphere up to the processing chambers 50.

Processing steps to be conducted until plasma processing begins in the processing chambers 50 will be described below. Immediately after the vacuum transfer robots 53a, 53b, 53c and 53d shown in FIGS. 11A to 11F are retracted from the processing chambers 50, the lifting pins 1 of FIG. 8 for securing the substrate support tray 4 to which the substrate 7 is secured move, and the backside of the substrate 7 comes into contact with the susceptor 2. Next, the shadow frame 5 is moved to overlie the substrate support tray 4 to press the substrate support tray 4 and the substrate 7. In this condition, heating is continued by using a heater (not shown) in the susceptor 2 until the substrate 7 is heated to a prescribed temperature and temperature distribution condition. When the prescribed condition is reached, predetermined plasma processing starts. After the plasma processing, the substrates 7 secured to the substrate support trays 4 are transferred to the atmosphere by taking the above-mentioned processing steps in the reverse order.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A plasma processing apparatus used for processing a substrate by plasma discharge, comprising a plasma processing chamber having a susceptor, a shadow frame and a substrate support tray therein, wherein the substrate support tray has a side and shape which enables the substrate support tray to support said substrate and to be positioned, while supporting said substrate, between said susceptor and said shadow frame during plasma processing.

2. The plasma processing apparatus of claim 1, wherein the shadow frame is disposed so as to be moved by a guide mechanism provided on an inner wall of the plasma processing chamber.

3. The plasma processing apparatus of claim 1, wherein the susceptor is secured in the plasma processing chamber.

4. The plasma processing apparatus of claim 3, wherein the shadow frame and the substrate support tray have shapes suited for centering the substrate.

5. The plasma processing apparatus of claim 3, wherein the substrate support tray is moved by lifting members provided on the susceptor.

6. The plasma processing apparatus of claim 3, wherein the substrate support tray is supported in the plasma processing chamber in a locked condition.

7. The plasma processing apparatus of claim 6, wherein a single plasma processing chamber is structured so that a plurality of substrates can be processed.

8. The plasma processing apparatus of claim 2, wherein the susceptor is secured in the plasma processing chamber.

9. The plasma processing apparatus of claim 4, wherein the substrate support tray is moved by lifting members provided on the susceptor.

10. The plasma processing apparatus of claim 5, wherein the substrate support tray is supported in the plasma processing chamber in a locked condition.

* * * * *